United States Patent
Sousa et al.

(10) Patent No.: US 11,428,719 B2
(45) Date of Patent: Aug. 30, 2022

(54) ELECTRICAL SIGNAL MEASUREMENT USING SUBDIVISION

(71) Applicant: Analog Devices International Unlimited Company, Limerick (IE)

(72) Inventors: Joseph L. Sousa, Billerica, MA (US); Micah Galletta O'Halloran, Andover, MA (US); Andrew Joseph Thomas, Arlington, MA (US)

(73) Assignee: Analog Devices International Unlimited Company, Limerick (IE)

( * ) Notice: Subject to any disclaimer, the term of this patent is extended or adjusted under 35 U.S.C. 154(b) by 412 days.

(21) Appl. No.: 16/739,675

(22) Filed: Jan. 10, 2020

(65) Prior Publication Data

US 2021/0215745 A1    Jul. 15, 2021

(51) Int. Cl.
| | | |
|---|---|---|
| *H03M 1/06* | (2006.01) | |
| *G01R 19/22* | (2006.01) | |
| *H03M 1/12* | (2006.01) | |
| *H03M 1/46* | (2006.01) | |

(52) U.S. Cl.
CPC ............ *G01R 19/22* (2013.01); *H03M 1/121* (2013.01); *H03M 1/466* (2013.01)

(58) Field of Classification Search
CPC ........ G01R 19/22; H03M 1/121; H03M 1/466
USPC .......................... 341/144, 119, 155, 128, 120
See application file for complete search history.

(56) References Cited

U.S. PATENT DOCUMENTS

| | | | |
|---|---|---|---|
| 6,025,695 A | 2/2000 | Friel et al. | |
| 7,081,193 B2 | 7/2006 | Dewey et al. | |
| 7,531,989 B2 | 5/2009 | Maireanu et al. | |
| 7,638,979 B2 | 12/2009 | Vandensande | |

(Continued)

FOREIGN PATENT DOCUMENTS

| | | |
|---|---|---|
| CN | 100350261 C | 11/2007 |
| CN | 102083257 A | 6/2011 |

(Continued)

OTHER PUBLICATIONS

"LTC6802-1: Multicell Battery Stack Monitor", Linear Technology Data Sheet, (2009), 39 pgs.

(Continued)

*Primary Examiner* — Peguy Jean Pierre
(74) *Attorney, Agent, or Firm* — Schwegman Lundberg & Woessner, P.A.

(57) ABSTRACT

A measurement circuit comprises an electronic circuit, multiple measurement channels, and a combining circuit. The electronic circuit includes a first terminal, a second terminal, and a non-resistive circuit element. Each of the multiple measurement channels includes a differential input connected to the electronic circuit. The differential inputs of the multiple measurement channels are connected in series and include a differential input coupled to the non-resistive circuit element. One input of a differential input of a first measurement channel of the multiple measurement channels is connected to the first terminal of the electronic circuit and one input of a differential input of a second measurement channel of the multiple measurement channels is connected to the second terminal of the electronic circuit. The combining circuit receives multiple outputs from the multiple measurement channels and produce a composite output signal.

20 Claims, 8 Drawing Sheets

(56) References Cited

U.S. PATENT DOCUMENTS

| | | |
|---|---|---|
| 8,081,019 B2 | 12/2011 | Jungreis |
| 8,796,995 B2 | 8/2014 | Cunanan et al. |
| 9,523,730 B2 | 12/2016 | Streit |
| 9,714,962 B2 * | 7/2017 | Albrecht ............. G01R 19/04 |
| 10,416,238 B2 | 9/2019 | Nortman et al. |
| 2008/0203985 A1 * | 8/2008 | Dong .................. H02M 3/157 |
| | | 323/272 |
| 2011/0121837 A1 | 5/2011 | Kim et al. |
| 2012/0101756 A1 | 4/2012 | Leung et al. |
| 2013/0162259 A1 | 6/2013 | Wynne |
| 2019/0302186 A1 | 10/2019 | Fifield et al. |

FOREIGN PATENT DOCUMENTS

| | | |
|---|---|---|
| DE | 10237920 | 2/2004 |
| JP | 2008147067 A | 6/2008 |
| KR | 100646543 B1 | 11/2006 |
| RU | 261872701 C | 5/2017 |
| WO | 02065142 | 8/2002 |
| WO | 2016150872 | 9/2016 |
| WO | WO-2019102053 A2 | 5/2019 |

OTHER PUBLICATIONS

Brunner, Doug, et al., "A robust cell voltage monitoring system for analysis and diagnosis of fuel cell or battery systems", Journal of Power Sources 195, (2010), 8006-8012.

Chang, Jocelyn, et al., "Tips and tricks for designing with voltage references", Texas Instruments, Inc., (2017), 34 pgs.

"Application Serial No. 21150226.5, Extended European Search Report dated May 27, 2021", 7 pgs.

\* cited by examiner

ELECTRICAL SIGNAL MEASUREMENT USING SUBDIVISION

FIELD OF THE DISCLOSURE

This document relates to electronic circuits to measure analog electrical signals and in particular to reducing the errors in measuring the signals.

BACKGROUND

Electronic circuits can be used to measure electrical signals. It is sometimes desired to measure an electrical signal with precision, such as by using an analog-to-digital converter (ADC) circuit. However, the signal to be monitored may have a wide voltage range or voltage span, making it difficult to measure with conventional precision ADC circuits.

SUMMARY OF THE DISCLOSURE

This document relates generally to circuits to monitor analog signals having a magnitude greater than what the available measurement circuits can measure without error. In some aspects, a measurement circuit includes an electronic circuit, multiple measurement channels, and a combining circuit. The electronic circuit includes a first terminal and a second terminal and a non-resistive circuit element. Each of the multiple measurement channels includes a differential input connected to the electronic circuit. The differential inputs of the multiple measurement channels are connected in series and include a differential input coupled to the non-resistive circuit element. One input of a differential input of a first measurement channel of the multiple measurement channels is connected to the first terminal and one input of a differential input of the last measurement channel of the multiple measurement channels is connected to the second terminal. The combining circuit receives multiple outputs from the multiple measurement channels and produces a composite output signal.

In some aspects, a method of measuring an analog electrical signal includes measuring an analog input signal between a first terminal and a second terminal of an electronic circuit using multiple measurement channels that each measure a portion of the analog input signal. The electronic circuit includes a non-resistive circuit element. Each of the multiple measurement channels includes a differential input connected to the electronic circuit. The differential inputs of the multiple measurement channels are connected in series and include a differential input coupled to the non-resistive circuit element. One input of a differential input of a first measurement channel of the multiple measurement channels is connected to the first terminal of the electronic circuit, and one input of a differential input of a second measurement channel of the multiple measurement channels is connected to the second terminal of the electronic circuit. The method includes combining outputs of the multiple measurement channels to produce a composite output signal.

In some aspects, an electrical circuit includes multiple measurement channels, a voltage divider circuit, and a summing circuit. Each of the measurement channels includes a differential analog to digital converter (ADC) circuit. The voltage divider circuit includes multiple resistor-capacitor (RC) circuits connected in series to divide an analog input signal among the ADC circuits of the multiple measurement channels. The summing circuit is configured to simultaneously receive multiple outputs from the ADC circuits and sum the multiple outputs to produce a composite output signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
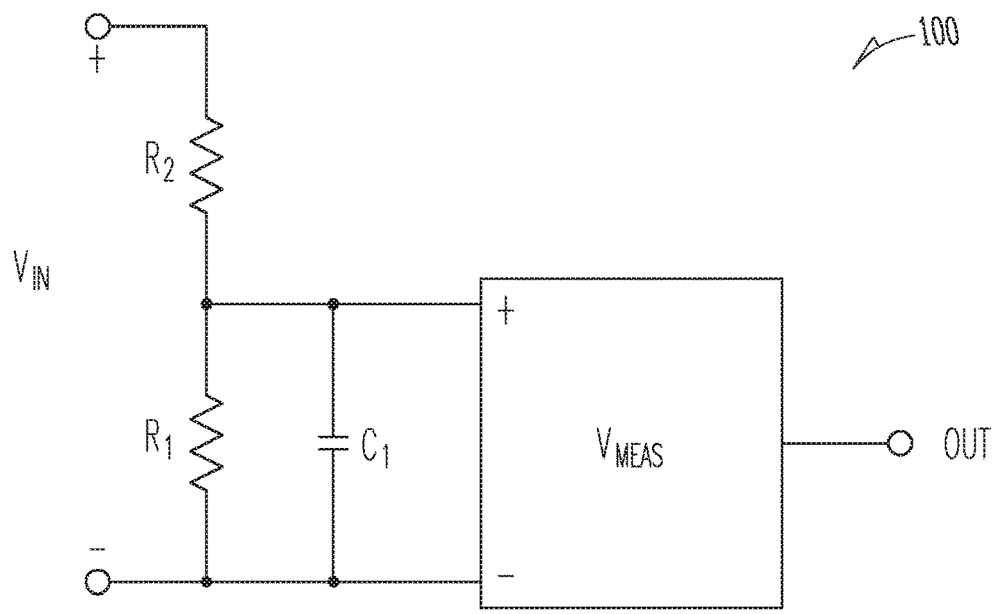
FIG. 1 is an example of a measurement circuit to measure a large voltage.

As explained previously herein, an analog signal with a large voltage magnitude may be difficult to measure using conventional measurement circuits that may not be designed to measure a signal of such large span. FIG. 1 is an example of a measurement circuit 100 to measure a large voltage. The circuit includes a resistive divider circuit comprised of passive resistances $R_1$ and $R_2$, and a voltage measurement circuit $V_{MEAS}$. The resistors scale the magnitude of the input voltage $V_{IN}$ to a voltage that can be measured with the voltage measurement circuit $V_{MEAS}$. Capacitance $C_1$ at the input to the measurement circuit represents a parasitic capacitance. The parasitic capacitance limits the bandwidth of the measurement. The speed of a signal that can be measured is limited because the voltage at the input to the voltage measurement circuit $V_{MEAS}$ settles with an RC time constant that includes the parasitic capacitance.

Figure 2:
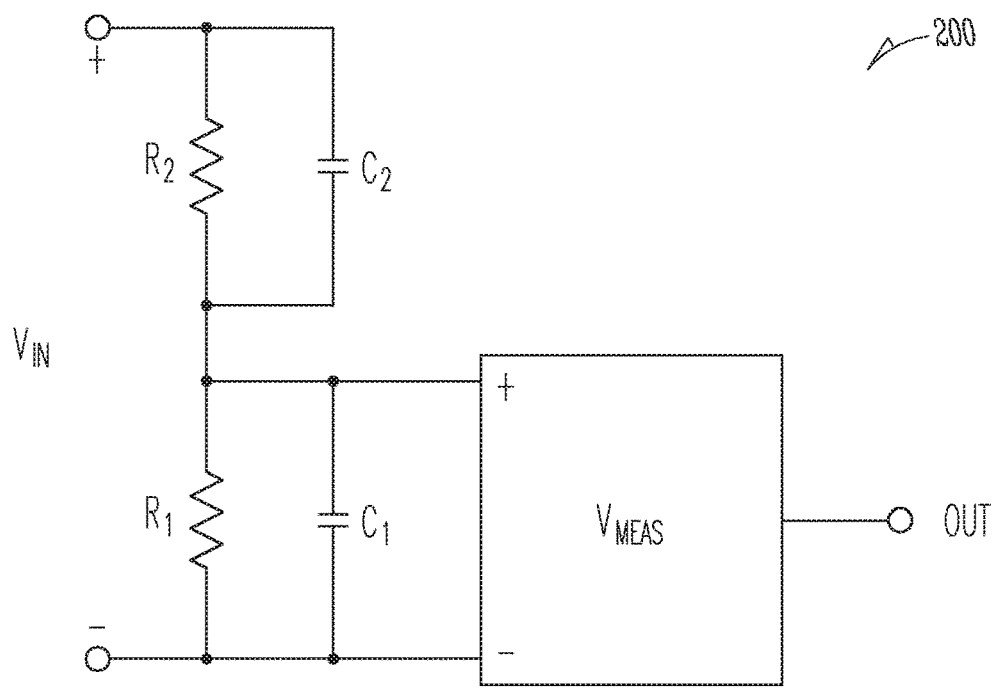
FIG. 2 is another example of a measurement circuit to measure a large voltage.

FIG. 2 is another example of a measurement circuit 200 to measure a large voltage. The circuit includes a resistive divider as in FIG. 1 and a measurement circuit $V_{MEAS}$. The circuit in FIG. 2 includes a capacitor $C_2$ added in parallel to $R_2$. If $(R_1 * C_1 = R_2 * C_2)$ the circuit passes all frequencies perfectly. A problem with the approach of FIG. 2 is that is impossible to exactly match the circuit elements so that $(R_1 * C_1 = R_2 * C_2)$. The components can only be matched to within the tolerance of the components, which may be worse than the desired accuracy of the measurement.

Figure 3:
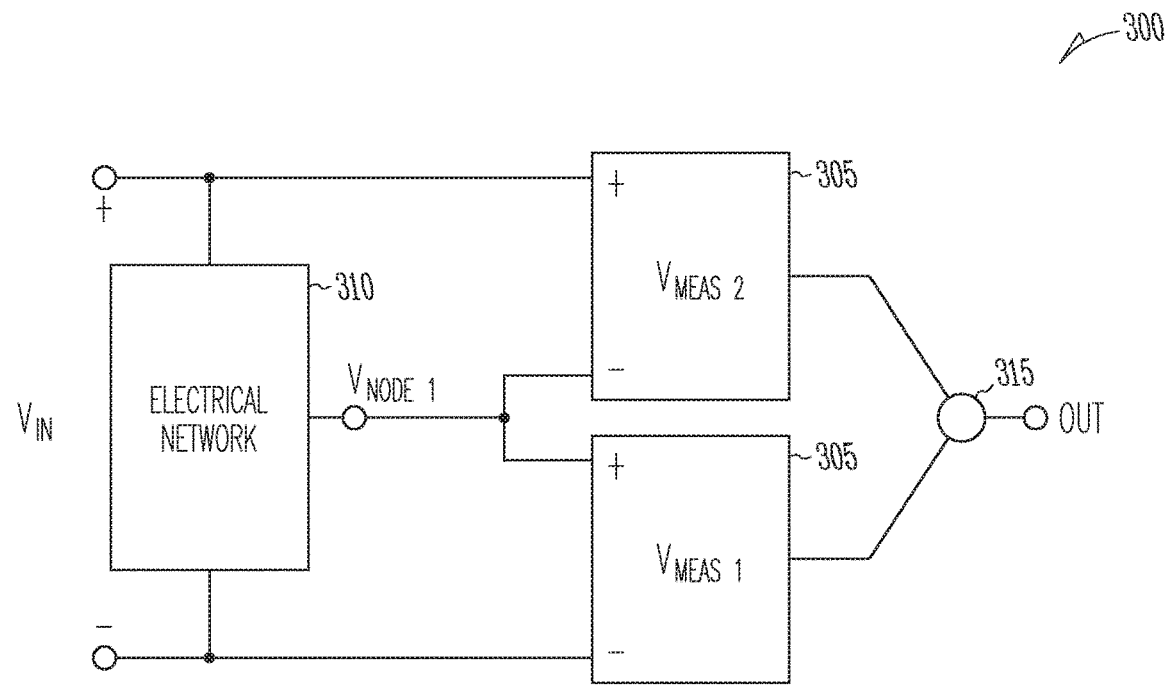
FIG. 3 is a block diagram of an example of a measurement circuit to monitor a large input voltage signal.

FIG. 3 is an example of a measurement circuit 300 to monitor a large input voltage signal. The input voltage is applied to an electrical network 310, that can be an electronic circuit. The electronic circuit includes a first terminal (labeled '+'), a second terminal (labeled '−') and at least one circuit node ($V_{NODE1}$) intermediate the first terminal and the second terminal. The measurement circuit also includes multiple measurement channels 305 that each include a differential input. The number of measurement channels is at least two, but some implementations may include dozens of channels. The differential inputs of the measurement channels are connected in series. One input of a differential input of a measurement channel is connected to the '+' terminal, and one input of a differential input of another measurement channel is connected to the '−' terminal The input voltage is distributed among the "series string" of inputs of measurement channels and each measurement channel measures a portion of the input voltage to form a partial measurement of the input voltage. The partial results of the channels can then be combined to form a measurement of the analog input signal. In FIG. 3, the measurement includes a combining circuit 315 that receives multiple outputs from the multiple measurement channels and produces a composite output signal that reconstitutes the original input signal.

The electronic circuit includes a non-resistive circuit element coupled to the circuit node ($V_{NODE1}$), and an input of a differential input of a measurement channel is coupled to the non-resistive circuit element. The resistive circuit element does not need to lie directly across both inputs of the differential input of the measurement channel, but may only have an interaction with the measurement channel by coupling to an input of the differential input. Some examples of the non-resistive circuit element include a capacitor, an inductor, a diode, a battery, an auto-transformer, and an active device (e.g., an amplifier).

Figure 4:
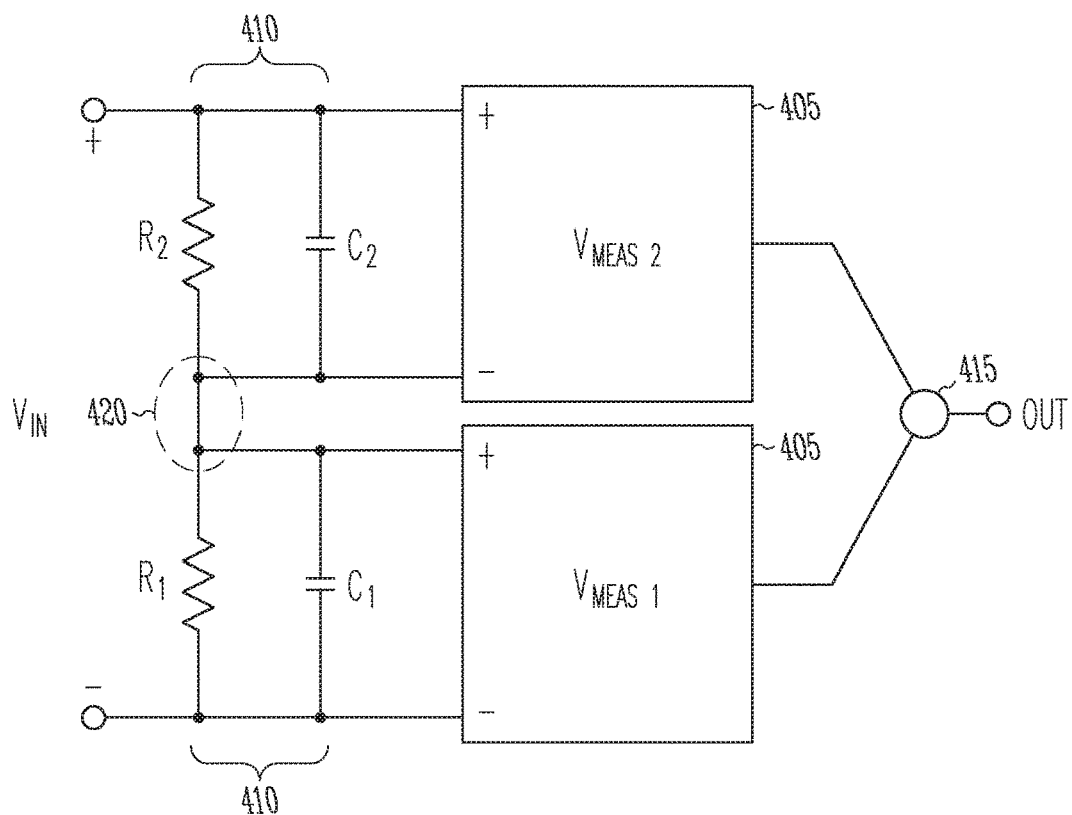
FIGS. 4-6 are block diagrams of other examples of a measurement circuit to monitor a large input voltage signal.

FIG. 4 is another example of a measurement circuit 400 to monitor a large input voltage signal. The electrical network includes two RC pairs ($R_1C_1$ and $R_2C_2$) connected in series at a circuit node 420, and a measurement channel 405 connected to each of the RC pairs. The measurement channels are also connected to the terminals of the electronic circuit and the circuit node 420.

The RC pairs form a voltage dividing circuit to distribute the analog input signal among the inputs of the measurement channels. If the RC pairs are matched, the input signal is divided equally between the differential inputs of the two measurement channels. As explained previously herein in regard to FIG. 2, the voltage dividing network may have voltage division accuracy errors that may stem from errors in accuracy of the individual components of the divider. For example, the individual components of the voltage divider may each have a 5% accuracy. In addition, other sources of error include component linearity errors or dynamic settling errors.

An advantage of the circuit in FIG. 4 over the circuit in FIG. 2 is that all these errors appear in complement and cancel out at the output once the multiple measurement channel outputs are combined (e.g., summed) together. Any voltage division error that gives one measurement channel too much signal is also subtracting the same amount from the adjacent measurement channel. The depth of the cancellation of errors is limited only by the common mode rejection of each channel and also by the gain match of each channel. For example, with a 0.1% gain match between channels, a 60 decibel (60 dB) attenuation of voltage division errors can be achieved. This method greatly reduces the requirements for accuracy of the network components, as well as reducing the impact of dynamic or non-linear division errors.

Figure 5:
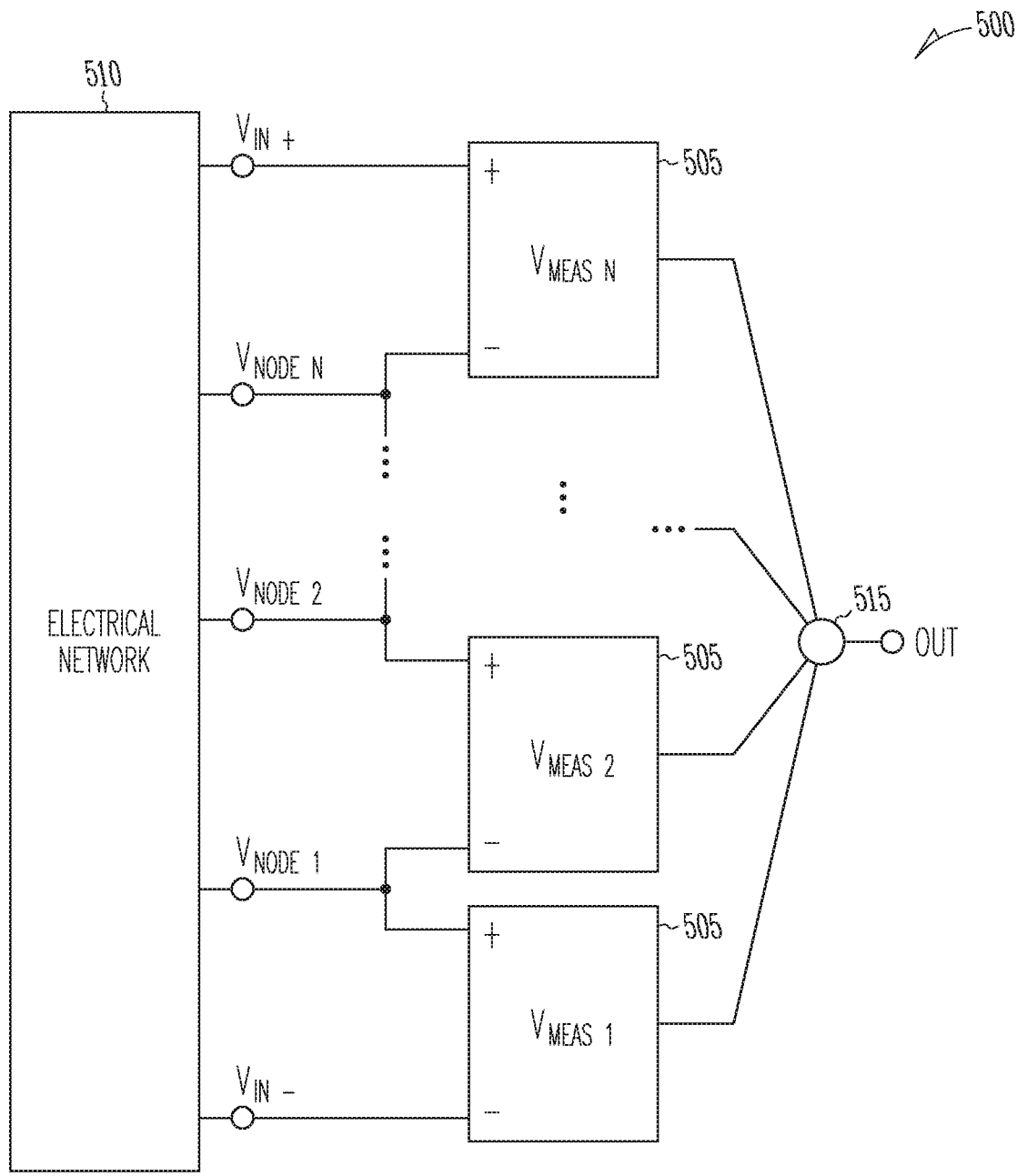

FIG. 5 is another example of a measurement circuit 500 to monitor a large input voltage signal. FIG. 5 is a more general case of the circuit of FIG. 3. The example includes N measurement channels 505, where N is an integer greater than two. One of the measurement channels ($V_{MEAS,1}$) is connected to the negative terminal of the electrical network 510 and an intermediate circuit node and another of the measurement channels ($V_{MEAS,N}$) is connected to the positive terminal and an intermediate circuit node. Measurement channels between $V_{MEAS,1}$ and $V_{MEAS,N}$ are connected to intermediate circuit nodes of the electrical network 510. A non-resistive circuit element is coupled to one or more of the intermediate circuit nodes. All errors at the N intermediate nodes of the electrical network 510 are canceled by the summing of the combining circuit 515.

It can be desirable to measure the analog input signal using an ADC having a differential input. The input voltage range of a differential ADC with wide common mode range can be increased by multiples by combining (e.g., series connecting) the inputs of multiple measurement channels with ADCs and connecting the combination to circuit nodes and terminals of the electrical network.

Figure 6:
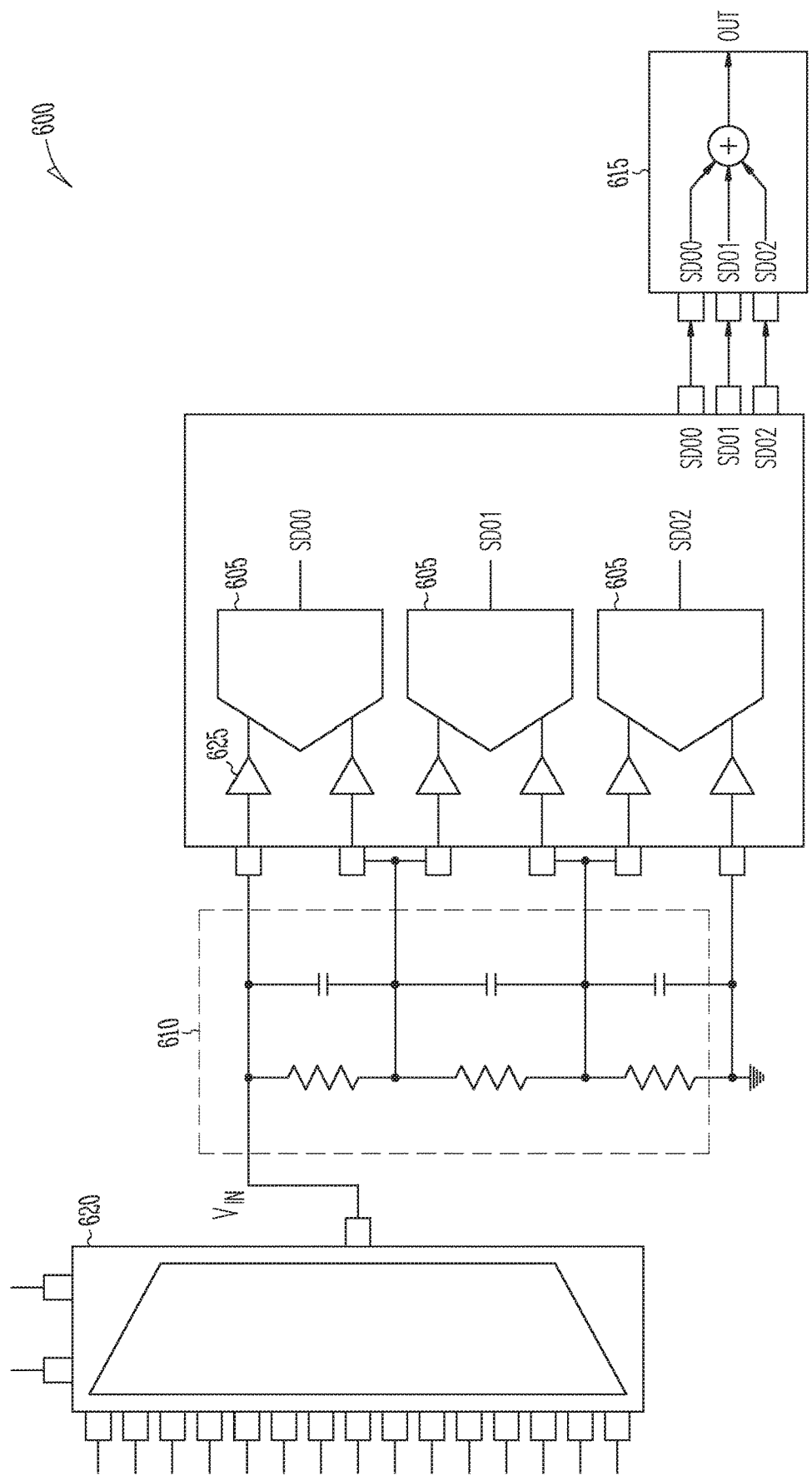

FIG. 6 is another example of a measurement circuit 600 to monitor a large input voltage signal. The measurement circuit includes three measurement channels 605, a voltage divider circuit 610 as the electrical network, and a summing circuit 615 as the combining circuit. Each measurement channel includes a successive approximation register analog-to-digital converter (SAR ADC) circuit.

Figure 7:
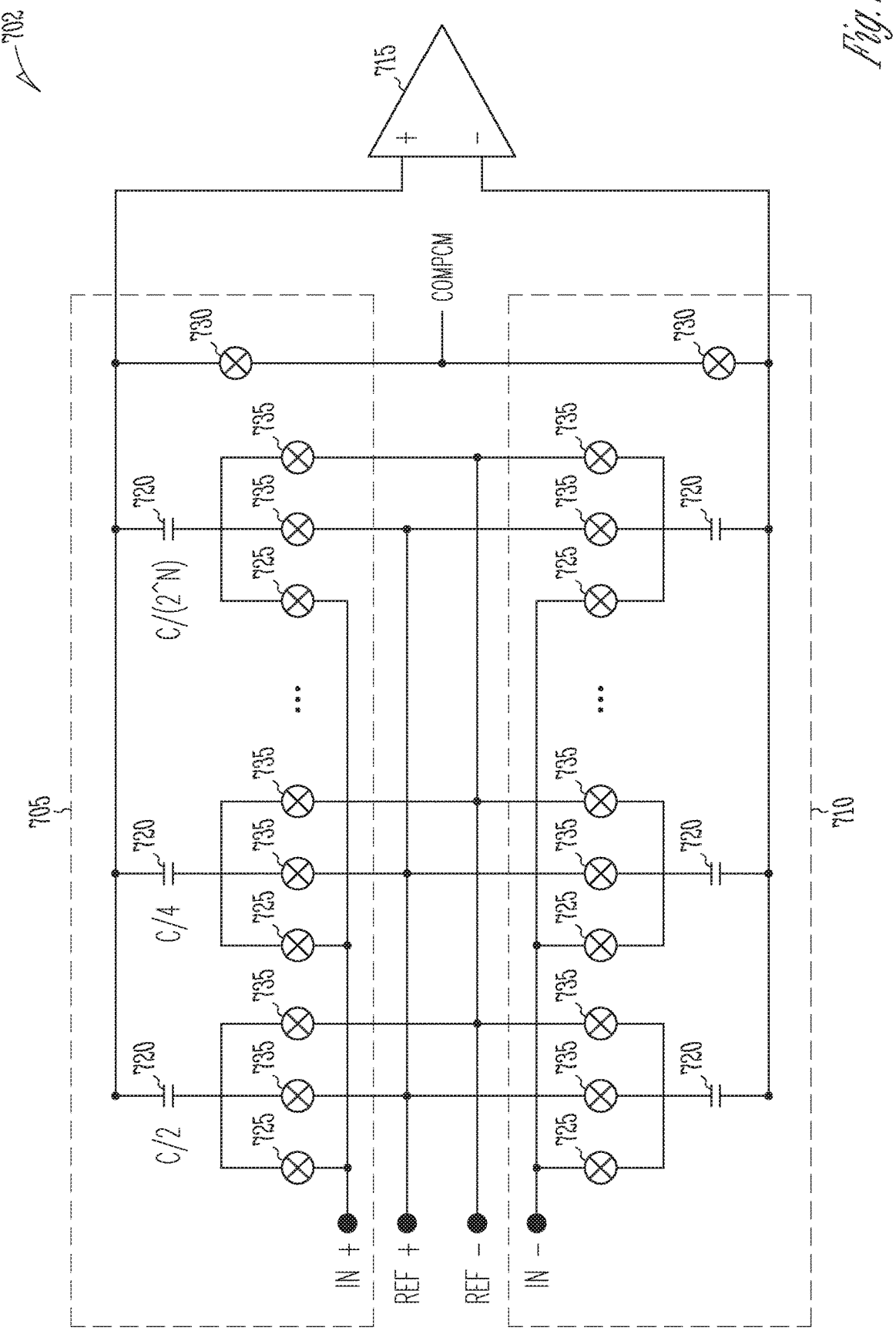
FIG. 7 is a functional block diagram of an example of a differential SAR ADC circuit.

FIG. 7 is a functional block diagram of an example of a differential SAR ADC circuit. The SAR ADC circuit 702 includes a positive digital-to-analog converter (DAC) 705, a negative DAC 710, and a comparator circuit 715. Each DAC includes weighted bit capacitors 720. In the example, the capacitors are weighted as C/2, C/4 . . . C/($2^N$), where N is the number of bits (e.g., N=8) in the DACs and C is the total capacitance of the bit capacitors added together. A differential analog input voltage (IN+, IN−) is sampled onto the bit capacitors with respect to the common mode of the comparator (CompCM) by closing switches 725 and 730. The input voltage is held on the capacitors by opening switches 730, then opening switches 725. The top plates of the capacitors are at the CompCM voltage.

The positive DAC 705 and the negative DAC 710 are also connected to positive and negative reference voltage (REF+, REF−). As part of the successive approximation routine, bit trials for each of the bit capacitors are performed iteratively. In a bit trial, the output of the positive DAC 705 and the output of the negative DAC 710 are applied to the inputs of the comparator circuit 715. Based on the output of the comparator circuit, a bit capacitor is connected to either REF+ or REF− using switches 735. If the bit capacitor is connected to REF+ the bit of the digital value corresponding to the bit capacitors is assigned a logic value '1', and if the bit capacitor is connected to REF+ the bit of the digital value corresponding to the bit capacitors is assigned a logic value '0'. Conversion then proceeds to the next bit capacitor until all bits of the digital value are determined.

Returning to FIG. 6, each of the measurement channels includes a precision 16-bit SAR ADC. Measurement channels with SAR ADCs of other than 16 bits can be used. The voltage divider circuit 610 includes three resistor-capacitor (RC) circuits connected in series that divide the input analog signal among the three ADCs of the three measurement channels. Each of the ADCs produces a digital value for the portion of the analog input signal it receives.

The digital channel outputs are then combined by summing to get the final result. The summing circuit 615 includes a digital circuit to add the digital outputs of the ADCs in parallel to produce the composite output result. In certain aspects, the digital circuit includes a processor that combines the outputs to produce the composite measurement of the analog input signal. It can be seen that combining the measurement channels does not add delay to the result other than the delay from combining the individual results together.

The RC-RC-RC voltage divider circuit of FIG. 6 includes three pairs of 33 Mega-ohm (33MΩ) resistors and 100 picofarad (100 pF) capacitors. The voltage divider circuit 610 can be used to stack three 10 Volt (10V) channels to accommodate an analog input having a 0-24V range. In general, if $V_{CH}$ is the voltage assigned to each channel input voltage $V_{IN}$ can be divided among the three channels as $V_{IN}=(3)(V_{CH})(\alpha)$, where $\alpha$ is the tolerance to errors. This RC-RC-RC divider requires no manual pole-zero match with the resistors and capacitors. The RC-RC-RC divider functions as an all-pass circuit, so the divider circuit can be used with a large range of signal frequencies. The parallel RC circuits connected in series ensures good coupling of AC signals to each channel, while any coupling errors are canceled out by the summing.

Any errors introduced by the ADC inputs into the measurement circuit, such as leakage current, charge kickback, and non-linear capacitance will cancel out in the summing. Active buffers 625 may be used at any point in the measurement channels.

The example of FIG. 6 also includes a multiplexer circuit 620. The multiplexer circuit 620 includes multiple inputs configured to receive multiple analog signals and an output coupled to the voltage divider circuit of the measurement circuit. A control input (A[3:0]) selectively applies an analog signal of the multiple analog signals to the voltage divider circuit for dividing and measurement. A sixteen-to-one (16:1) multiplexer is shown in the example. Each input may provide an analog input signal from a sensor of an array of sixteen sensors. The output of each of the sensors may be selected and measured according to the control input. A controller (not shown) may be coupled to the multiplexer, the measurement channels, and the summing circuit to coordinate measurements of the array of sensors. In certain examples, if the summing circuit includes digital circuitry, the digital circuitry may set the control input of the multiplexer.

The series connected impedances of the voltage divider circuit do not need to be the same, and the voltages applied to the measurement channels do not need to be divided evenly among the channels. Different impedance values can be included in the series to apply different voltages to the multiple measurement channels. Other components can be used in the voltage divider circuit.

Figure 8:
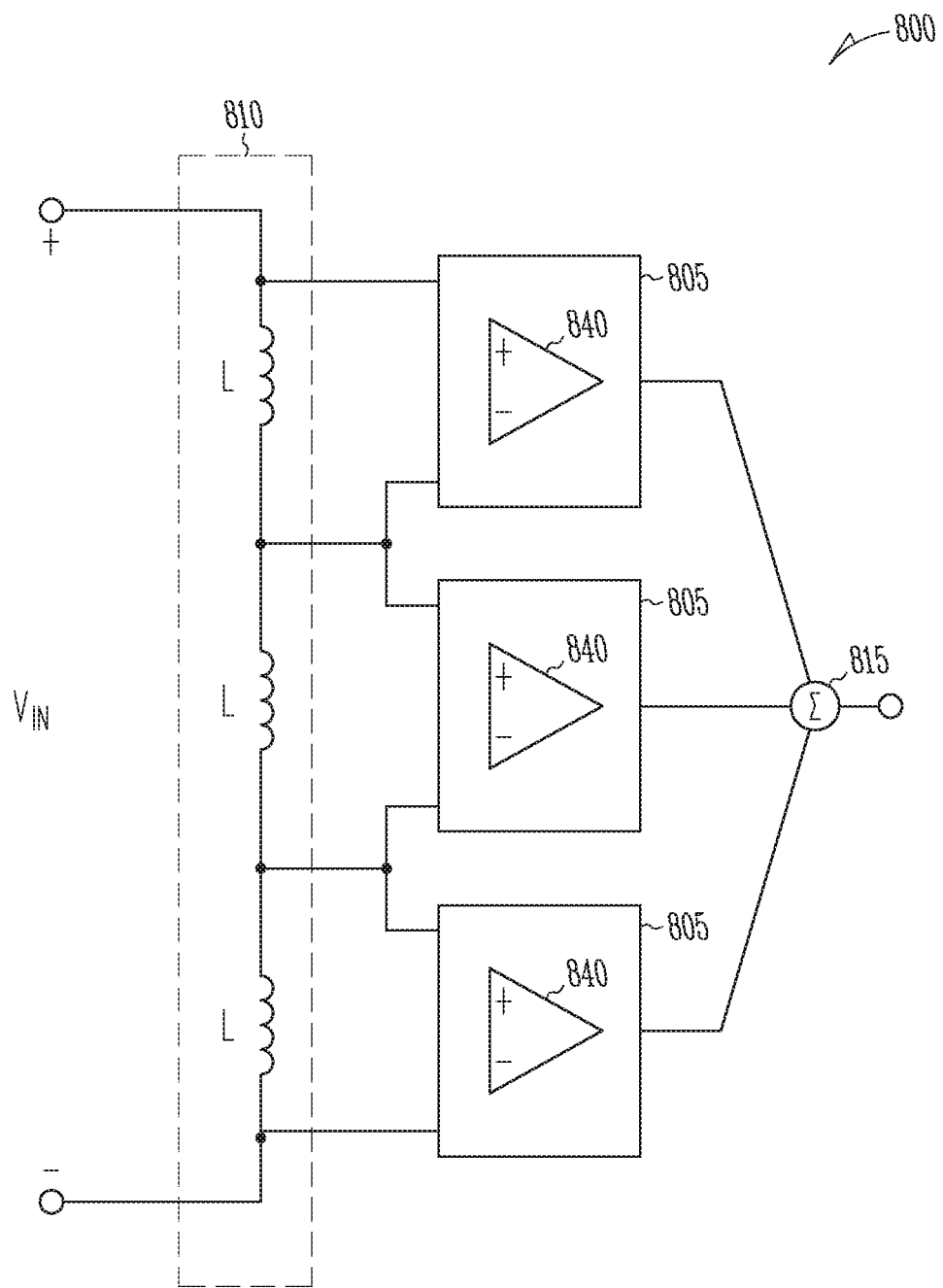
FIGS. 8-9 are block diagrams of further examples of a measurement circuit to monitor a large input voltage signal.

FIG. 8 is a block diagram of another example of a measurement circuit 800. The electrical network 810 includes a series connection of inductors (L). The multiple measurement channels 805 includes a series connection of differential input amplifiers. The amplifiers 840 may be instrumentation amplifiers or isolated amplifiers. The amplifiers accommodate wider input voltage spans than each individual amplifier can accommodate alone. The electrical network 810 is connected to the inputs of the amplifiers. The outputs of the amplifiers are provided to an analog summing circuit 815. Some examples of an analog summing circuit 815 are a summing amplifier or voltage adding circuit. The analog summing circuit 815 adds the multiple outputs of the multiple measurement channels and produces a composite output signal. In variations, the outputs of the amplifiers of the channels are applied to ADCs and summed.

Figure 9:
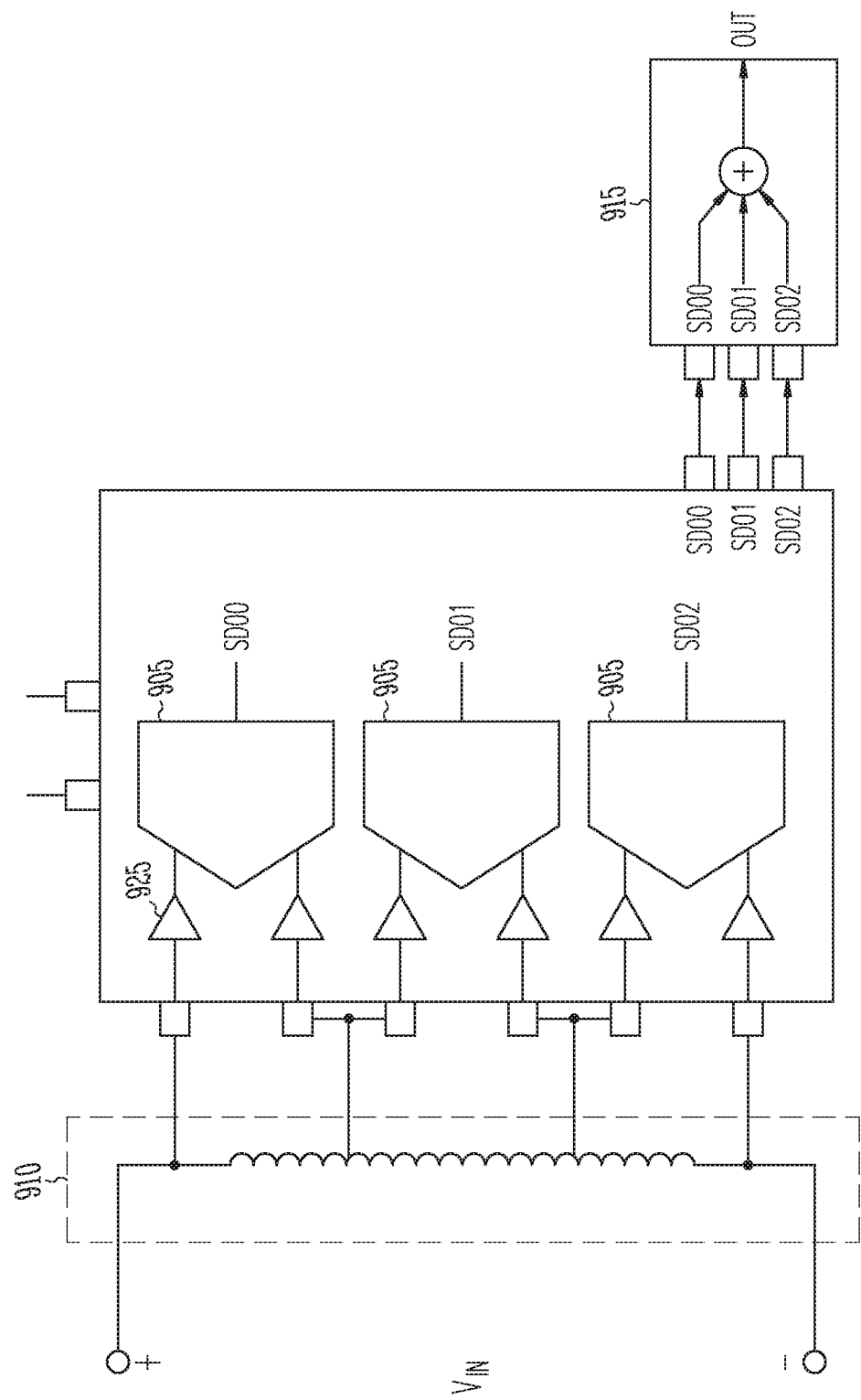

FIG. 9 is a block diagram of another example of a measurement circuit 900. The voltage divider circuit 910 includes an auto-transformer with multiple terminals or taps along the winding. Different taps from the auto-transformer are applied to the multiple measurement channels 905. Each measurement channel 905 includes a SAR ADC. The outputs of the ADCs are summed digitally. The auto-transformer distributes the signal coarsely among various channels, with the auto-transformer errors cancelling out in the digital summing of the multiple channels. The use of auto-transformer as the voltage divider may be useful for radio frequency (RF) applications and AC coupled applications.

Returning to FIG. 5, the electrical network 510 may include combinations of the electrical circuits described previously herein. In certain aspects, the electrical network 510 can include at least one battery and at least one RC circuit connected in series. In certain aspects, the electrical network 510 can include at least one active circuit element.

Figure 10:
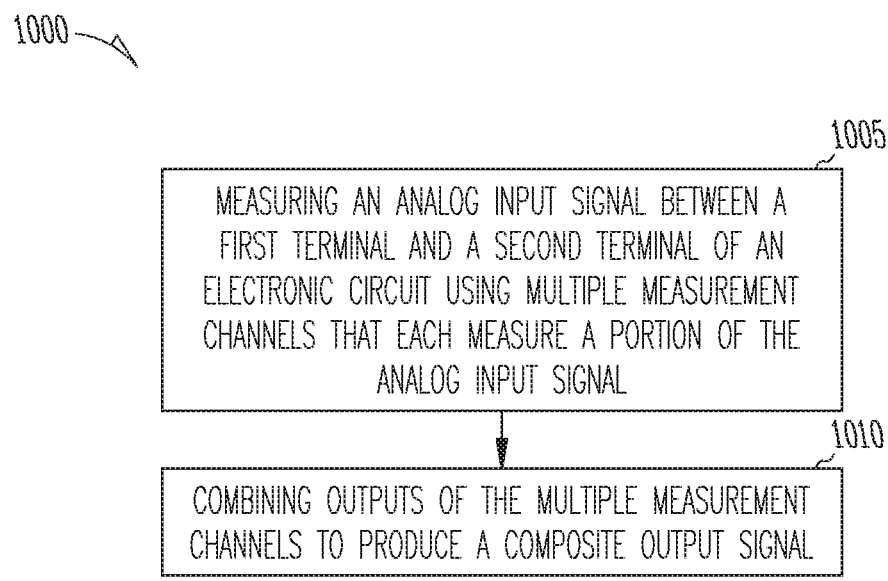
FIG. 10 is a flow diagram of a method of measuring an analog electrical signal.

For completeness, FIG. 10 is a flow diagram of a method 1000 of measuring an analog electrical signal. At 1005, an analog input signal is measured between a first terminal and a second terminal of an electronic circuit using multiple measurement channels that each measure a portion of the analog input signal. The electronic circuit includes at least one a non-resistive circuit element. The electronic circuit may be any of the electrical networks described previously herein and may include one or more passive storage devices, such as capacitors, inductors, or transformers. In variations, the electronic circuit may include active circuit components, may include diodes, and may include batteries.

Each of the multiple measurement channels includes a differential input connected to the electronic circuit. The differential inputs of the multiple measurement channels are connected in series and include a differential input coupled to a non-resistive circuit element. One input of a differential input of a first measurement channel of the multiple measurement channels is connected to the first terminal and one input of a differential input of a second measurement channel of the multiple measurement channels is connected to the second terminal. The measurement channels may be any of the measurement channels described herein and can include one or both of differential input ADCs and differential input amplifiers. At 1010, the outputs of the multiple measurement channels are combined to produce a composite output signal. The combining may be performed using a digital summing circuit, analog summing circuit, or processor. The composite output signal may reconstitute the original input signal.

The devices, systems and methods described herein include series connected measurement channels coupled to low accuracy analog input distributing networks that may be used to expand an input voltage range of measurement circuits. The measurement channels reduce errors due to the analog input networks and reduce distortion by sharing the input voltage swing among the multiple channels. The measurement channels described herein have a wide common mode voltage range, and their common mode rejection ratio (CMRR) is high.

Additional Description and Aspects

A first Aspect (Aspect 1), includes subject matter (such as a measurement circuit) comprising an electronic circuit including a first terminal, a second terminal, and a non-resistive circuit element; multiple measurement channels, wherein each of the multiple measurement channels includes a differential input connected to the electronic circuit, wherein the differential inputs of the multiple measurement channels are connected in series and include a differential input coupled to the non-resistive circuit element, and wherein one input of a differential input of a first measurement channel of the multiple measurement channels is connected to the first terminal and one input of a differential input of a second measurement channel of the multiple measurement channels is connected to the second terminal; and a combining circuit configured to receive multiple outputs from the multiple measurement channels and produce a composite output signal.

In Aspect 2, the subject matter of Aspect 1 optionally includes multiple circuit elements coupled between the first terminal and the second terminal, wherein the multiple circuit elements include the non-resistive circuit element, and wherein the multiple circuit elements are configured to distribute the analog input signal among the multiple differential inputs of the multiple measurement channels.

In Aspect 3, the subject matter of Aspect 2 optionally includes multiple circuit elements including multiple resistor-capacitor (RC) circuits connected in series.

In Aspect 4, the subject matter of Aspect 2 optionally includes multiple circuit elements including multiple inductors connected in series.

In Aspect 5, the subject matter of Aspect 2 optionally includes multiple circuit elements including at least one battery.

In Aspect 6, the subject matter of one or any combination of Aspects 1-5 optionally includes an electronic circuit including an auto-transformer with at least a third terminal coupled to an input of a differential input of a measurement channel of the multiple measurement channels.

In Aspect 7, the subject matter of one or any combination of Aspects 1-6 optionally includes each of the measurement channels including an analog-to-digital converter (ADC) circuit, and a combining circuit including a digital circuit to add multiple digital outputs of the multiple measurement channels to produce the composite output signal.

In Aspect 8, the subject matter of one or any combination of Aspects 1-6 optionally includes each of the measurement channels including a differential input amplifier, and a combining circuit including an analog summing circuit to add multiple outputs of the multiple measurement channels to produce the composite output signal.

In Aspect 9, the subject flatter of one or any combination of Aspects 1-8 optionally includes a multiplexer circuit including an output coupled to the first terminal or the second terminal; multiple inputs configured to receive multiple analog signals; and a control input configured to selectively apply an analog signal of the multiple analog signals to the first terminal or the second terminal.

Aspect 10 includes subject matter (such as a method of measuring an analog electrical signal, or a computer readable medium including instructions that, when executed by processing circuitry of a machine, cause the machine to perform the method) or can optionally be combined one or any combination of Aspects 1-9 to include such subject matter, comprising measuring an analog input signal between a between a first terminal and a second terminal of an electronic circuit using multiple measurement channels that each measure a portion of the analog input signal, and combining outputs of the multiple measurement channels to produce a composite output signal. The electronic circuit includes a non-resistive circuit element. Each of the multiple measurement channels includes a differential input connected to the electronic circuit. The differential inputs of the multiple measurement channels are connected in series and include a differential input coupled to the non-resistive circuit element. One input of a differential input of a first measurement channel of the multiple measurement channels is connected to the first terminal and one input of a differential input of a second measurement channel of the multiple measurement channels is connected to the second terminal.

In Aspect 11, the subject matter of Aspect 10 optionally includes distributing the analog input signal among multiple differential input analog to digital converter (ADC) circuits and summing digital outputs of the multiple ADC circuits to produce the composite output signal.

In Aspect 12, the subject matter of Aspect 10 optionally includes distributing the analog input signal among multiple differential input amplifiers and summing analog outputs of the multiple differential input amplifiers to produce the composite output signal.

In Aspect 13, the subject matter of one or any combination of Aspects 10-12 optionally includes dividing the analog input signal using multiple resistor-capacitor (RC) circuits connected in series.

In Aspect 14, the subject matter of one or any combination of Aspects 10-12 optionally includes dividing the analog input signal using multiple inductors connected in series.

In Aspect 15, the subject matter of one or any combination of Aspects 10-12 optionally includes applying the analog input signal using to an auto-transformer of the electronic circuit, wherein the auto-transformer includes a third terminal coupled to an input of a differential input of a measurement channel of the multiple measurement channels.

In Aspect 16, the subject matter of one or any combination of Aspects 10-15 optionally includes distributing the analog input signal unevenly among the multiple measurement channels.

Aspect 17 can include subject matter (such as an electrical circuit) or can optionally be combined with one or any combination of Aspects 1-16 to include such subject matter, comprising multiple measurement channels, each of the measurement channels including a differential analog to digital converter (ADC) circuit; a voltage divider circuit including multiple resistor-capacitor (RC) circuits connected in series to divide an analog input signal among the ADC circuits of the multiple measurement channels; and a summing circuit configured to simultaneously receive multiple outputs from the ADC circuits and sum the multiple outputs to produce a composite output signal.

In Aspect 18, the subject matter of Aspect 17 can optionally include ADC circuits that are successive approximation register (SAR) ADC circuits.

In Aspect 19, the subject matter of one or both of Aspects 17 and 18 can optionally include a multiplexer circuit including an output coupled to the voltage divider circuit, multiple inputs configured to receive multiple analog signals, and a control input configured to selectively apply an analog signal of the multiple analog signals to the voltage divider circuit.

In Aspect 20, the subject matter of one or any combination of Aspects 17-19 can optionally include a summing circuit including an output coupled to the multiplexer circuit and the summing circuit configured to select the analog signal of the multiple analog signals to be applied to the voltage divider circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A measurement circuit comprising:
   an electronic circuit including a first terminal, a second terminal, and a non-resistive circuit element;
   multiple measurement channels, wherein each of the multiple measurement channels includes a differential input connected to the electronic circuit, wherein the differential inputs of the multiple measurement channels are connected in series and include a differential input coupled to the non-resistive circuit element, and wherein one input of a differential input of a first measurement channel of the multiple measurement channels is connected to the first terminal and one input of a differential input of a second measurement channel of the multiple measurement channels is connected to the second terminal; and
   a combining circuit configured to receive multiple outputs from the multiple measurement channels and produce a composite output signal.

2. The measurement circuit of claim 1, wherein the electronic circuit includes multiple circuit elements coupled between the first terminal and the second terminal, wherein the multiple circuit elements include the non-resistive circuit element, and wherein the multiple circuit elements are configured to distribute an analog input signal among the multiple differential inputs of the multiple measurement channels.

3. The measurement circuit of claim 2, wherein the multiple circuit elements include multiple resistor-capacitor (RC) circuits connected in series.

4. The measurement circuit of claim 2, wherein the multiple circuit include multiple inductors connected in series.

5. The measurement circuit of claim 2, wherein the multiple circuit elements include at least one battery.

6. The measurement circuit of claim 1, wherein the electronic circuit includes an auto-transformer with at least a third terminal coupled to an input of a differential input of a measurement channel of the multiple measurement channels.

7. The measurement circuit of claim 1, wherein each of the measurement channels includes an analog-to-digital converter (ADC) circuit, and the combining circuit includes a digital circuit to add multiple digital outputs of the multiple measurement channels to produce the composite output signal.

8. The measurement circuit of claim 1, wherein each of the measurement channels includes a differential input amplifier, and the combining circuit includes an analog summing circuit to add multiple outputs of the multiple measurement channels to produce the composite output signal.

9. The measurement circuit of claim 1, including a multiplexer circuit, the multiplexer circuit including:
   an output coupled to the first terminal or the second terminal;
   multiple inputs configured to receive multiple analog signals; and
   a control input configured to selectively apply an analog signal of the multiple analog signals to the first terminal or the second terminal.

10. A method of measuring an analog electrical signal, the method comprising:
    measuring an analog input signal between a first terminal and a second terminal of an electronic circuit using multiple measurement channels that each measure a portion of the analog input signal;
    wherein the electronic circuit includes a non-resistive circuit element;
    wherein each of the multiple measurement channels includes a differential input connected to the electronic circuit, wherein the differential inputs of the multiple measurement channels are connected in series and include a differential input coupled to the non-resistive circuit element, and wherein one input of a differential input of a first measurement channel of the multiple measurement channels is connected to the first terminal and one input of a differential input of a second measurement channel of the multiple measurement channels is connected to the second terminal; and
    combining outputs of the multiple measurement channels to produce a composite output signal.

11. The method of claim 10,
wherein measuring the analog input signal using multiple measurement channels includes distributing the analog input signal among multiple differential input analog to digital converter (ADC) circuits; and
wherein combining outputs of the multiple measurement channels includes summing digital outputs of the multiple ADC circuits to produce the composite output signal.

12. The method of claim 10,
wherein measuring the analog input signal using multiple measurement channels includes distributing the analog input signal among multiple differential input amplifiers; and
wherein combining outputs of the multiple measurement channels includes summing analog outputs of the multiple differential input amplifiers to produce the composite output signal.

13. The method of claim 10, wherein measuring the analog input signal includes dividing the analog input signal using multiple resistor-capacitor (RC) circuits connected in series.

14. The method of claim 10, wherein measuring the analog input signal dividing the analog input signal using multiple inductors connected in series.

15. The method of claim 10, wherein measuring the analog input signal includes applying the analog input signal to an auto-transformer electronic circuit, wherein the auto-transformer includes a third terminal coupled to an input of a differential input of a measurement channel of the multiple measurement channels.

16. The method of claim 10, wherein measuring the analog input signal includes distributing the analog input signal unevenly among the multiple measurement channels.

17. An electrical circuit comprising:
multiple measurement channels, each of the measurement channels including a differential analog to digital converter (ADC) circuit;
a voltage divider circuit including multiple resistor-capacitor (RC) circuits connected in series to divide an analog input signal among the ADC circuits of the multiple measurement channels; and
a summing circuit configured to simultaneously receive multiple outputs from the ADC circuits and sum the multiple outputs to produce a composite output signal.

18. The electrical circuit of claim 17, wherein the ADC circuits are each successive approximation register (SAR) ADC circuits.

19. The electrical circuit of claim 17, including a multiplexer circuit including an output coupled to the voltage divider circuit, multiple inputs configured to receive multiple analog signals, and a control input configured to selectively apply an analog signal of the multiple analog signals to the voltage divider circuit.

20. The electrical circuit of claim 17, wherein the summing circuit includes an output coupled to the multiplexer circuit and the summing circuit is configured to select the analog signal of the multiple analog signals to be applied to the voltage divider circuit.

* * * * *